(12) United States Patent
Park et al.

(10) Patent No.: US 12,471,463 B2
(45) Date of Patent: Nov. 11, 2025

(54) DISPLAY PANEL AND DISPLAY DEVICE WITH STRUCTURE WHERE SIGNAL LINE AND ELECTRODE OF LIGHT EMITTING ELEMENT ARE DISPOSED IN SAME LAYER

(71) Applicant: LG Display Co., Ltd., Seoul (KR)

(72) Inventors: EunJi Park, Wonju-si (KR); InHyo Han, Seoul (KR); Daeyoung Seo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 523 days.

(21) Appl. No.: 17/976,557

(22) Filed: Oct. 28, 2022

(65) Prior Publication Data

US 2023/0217744 A1 Jul. 6, 2023

(30) Foreign Application Priority Data

Dec. 31, 2021 (KR) .................. 10-2021-0194695

(51) Int. Cl.
*H10K 59/131* (2023.01)
*H10D 86/40* (2025.01)
(Continued)

(52) U.S. Cl.
CPC ......... *H10K 59/131* (2023.02); *H10D 86/441* (2025.01); *H10D 86/60* (2025.01); *H10K 59/1213* (2023.02); *H10K 59/1216* (2023.02)

(58) Field of Classification Search
CPC ............. H10K 59/131; H10K 59/1213; H10K 59/1216; H10K 59/122; H10K 59/124;
(Continued)

(56) References Cited

U.S. PATENT DOCUMENTS 10,916,615 B1 2/2021 Hu et al.
12,154,498 B2 * 11/2024 Li ........................... G09G 3/32
(Continued)

FOREIGN PATENT DOCUMENTS

CN 110767738 A 2/2020
CN 113241343 A 8/2021
(Continued)

*Primary Examiner* — Tan N Tran
(74) *Attorney, Agent, or Firm* — Seed Intellectual Property Law Group LLP

(57) ABSTRACT

Embodiments of the disclosure relate to a display panel and a display device. Specifically, there may be provided a display panel and display device capable of simplifying the process, by comprising a substrate, first to fourth signal lines and an active layer disposed on the substrate, a first metal layer and a second metal layer disposed on a portion of an upper surface of the active layer and spaced apart from each other, a first insulation film disposed on the first and second metal layers, a second insulation film disposed on the first insulation film, an electrode pattern disposed on the active layer and the first insulation film and not overlapping the second insulation film, and a fifth signal line disposed on the second insulation film and crossing the first to fourth signal lines spaced apart from each other, wherein the first electrode contacts an upper surface of the first metal layer disposed on the active layer, and wherein the fifth signal line is disposed on the same layer as the first electrode.

20 Claims, 21 Drawing Sheets

(51) Int. Cl.
*H10D 86/60* (2025.01)
*H10K 59/121* (2023.01)

(58) Field of Classification Search
CPC .... H10K 59/121; H10D 86/441; H10D 86/60; H10D 30/6729; H10D 86/0231; H10D 86/443; H10D 86/451; H10D 86/481
See application file for complete search history.

(56) References Cited

U.S. PATENT DOCUMENTS

| | | |
|---|---|---|
| 2012/0068185 A1 | 3/2012 | Kim et al. |
| 2012/0217517 A1 | 8/2012 | Choi et al. |
| 2018/0261628 A1 | 9/2018 | Imai et al. |
| 2019/0067340 A1 | 2/2019 | Shu et al. |
| 2019/0189720 A1 | 6/2019 | Lim et al. |
| 2020/0091264 A1 | 3/2020 | Lee et al. |
| 2020/0373362 A1 | 11/2020 | Won et al. |
| 2021/0173244 A1 | 6/2021 | Jeong et al. |
| 2021/0313400 A1 | 10/2021 | Bae et al. |
| 2022/0367432 A1 | 11/2022 | Xia et al. |

FOREIGN PATENT DOCUMENTS

| | | |
|---|---|---|
| JP | 2018205718 A | 12/2018 |
| JP | 2019109509 A | 7/2019 |
| WO | WO 2017094644 A1 | 6/2017 |

\* cited by examiner

DISPLAY PANEL AND DISPLAY DEVICE WITH STRUCTURE WHERE SIGNAL LINE AND ELECTRODE OF LIGHT EMITTING ELEMENT ARE DISPOSED IN SAME LAYER

CROSS-REFERENCE TO RELATED APPLICATION

This application claims priority from Korean Patent Application No. 10-2021-0194695, filed on Dec. 31, 2021, which is hereby incorporated by reference for all purposes as if fully set forth herein.

BACKGROUND

Technical Field

Embodiments of the disclosure relate to a display panel and a display device.

Description of the Related Art

A display device includes a thin film transistor (TFT), a storage capacitor, and a plurality of lines.

The substrate for manufacturing the display device includes fine patterns, such as thin film transistors, capacitors, and lines, and the display device is operated by complex connections between thin film transistors, storage capacitors, and lines.

BRIEF SUMMARY

Embodiments of the disclosure relate to a display panel and display device, capable of simplifying the process and reducing the number of masks required for the process.

Embodiments of the disclosure relate to a display panel and display device, capable of preventing degradation of the characteristics of the driving transistor by internal light.

Embodiments of the disclosure relate to a display panel and display device, capable of preventing damage to a signal line due to a step between components disposed under the signal line.

Embodiments of the disclosure may provide a display device comprising a substrate, first to fourth signal lines and an active layer disposed on the substrate, a first metal layer and a second metal layer disposed on a portion of an upper surface of the active layer and spaced apart from each other, a first insulation film disposed on the first and second metal layers, a second insulation film disposed on the first insulation film and overlapping at least a portion of the first and second metal layers disposed on the active layer, overlapping the first to fourth signal lines, and not overlapping a portion of the upper surface of the active layer, an electrode pattern disposed on the active layer and the first insulation film and not overlapping the second insulation film, a fifth signal line disposed on the second insulation film and crossing the first to fourth signal lines spaced apart from each other, a light emitting layer disposed on the first electrode, and a second electrode disposed on the light emitting layer, wherein the first electrode contacts an upper surface of the first metal layer disposed on the active layer, and wherein the fifth signal line is disposed on the same layer as the first electrode.

Embodiments of the disclosure may provide a display panel comprising first to fourth signal lines and an active layer disposed on a substrate divided into an emission area and a non-emission area, a first metal layer and a second metal layer disposed on a portion of an upper surface of the active layer and spaced apart from each other, a first insulation film disposed on the first and second metal layers, a second insulation film disposed on the first insulation film and overlapping at least a portion of the first and second metal layers disposed on the active layer, overlapping the first to fourth signal lines, and not overlapping a portion of the upper surface of the active layer, an electrode pattern disposed on the active layer and the first insulation film and not overlapping the second insulation film, a fifth signal line disposed on the second insulation film and crossing the first to fourth signal lines spaced apart from each other, a light emitting layer disposed on the first electrode, and a second electrode disposed on the light emitting layer, wherein the first electrode contacts an upper surface of the first metal layer disposed on the active layer, and wherein the fifth signal line is disposed on the same layer as the first electrode.

According to embodiments of the disclosure, the active layer, the plurality of signal lines, and the pad electrode may be formed in the same process, and the first electrode of the organic light emitting diode, at least one signal line, electrode pattern, plate, and pad electrode may be formed in the same process, so that it is possible to provide a display panel and display device capable of simplifying the process and reducing the number of masks required for the process.

Embodiments of the disclosure relate to a display panel and display device capable of preventing degradation of the characteristics of the driving transistor by preventing the internal light from reaching the channel area of the driving transistor through multiple slits provided in the third insulation film and by increasing the distance between the opening and the driving transistor.

Embodiments of the disclosure may provide a display panel and display device capable of preventing damage to a signal line due to a step in components disposed under the signal line as at least one signal line is disposed on the same layer as the first electrode of the organic light emitting diode OLED.

BRIEF DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
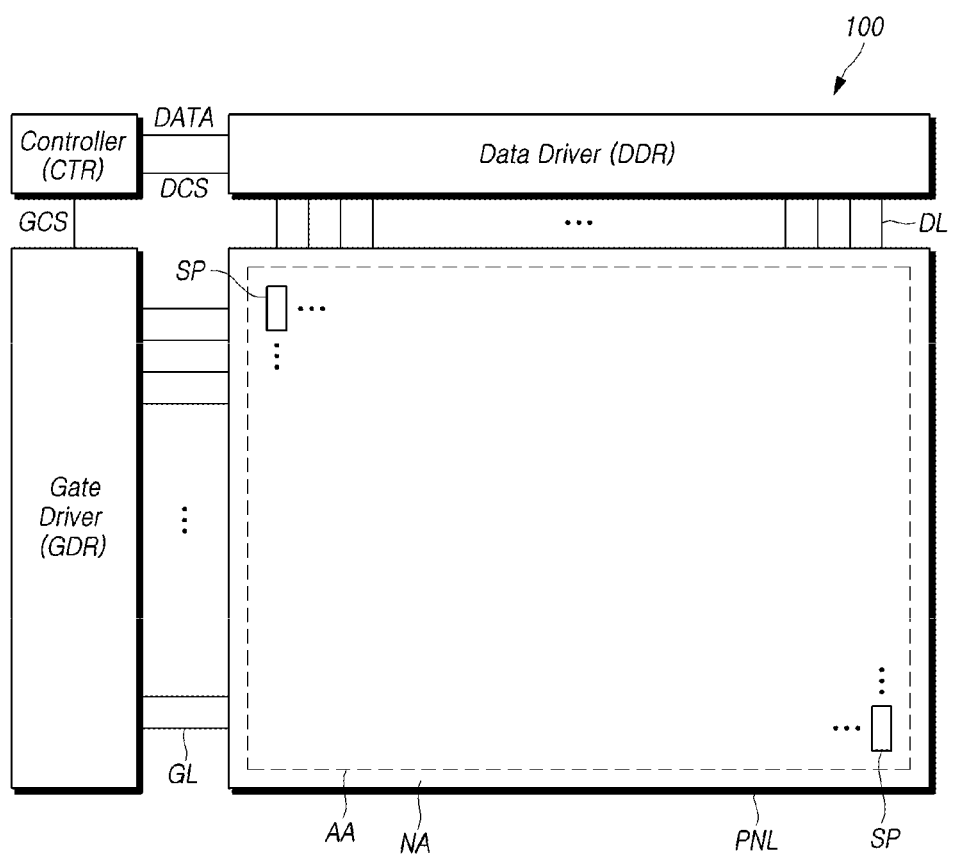
FIG. 1 is a view schematically illustrating a system configuration of an organic light emitting display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements, etc., but is used merely to distinguish the corresponding element from other elements.

When it is mentioned that a first element "is connected or coupled to", "contacts or overlaps", etc., a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc., each other via a fourth element. Here, the second element may be included in at least one of two or more elements that "are connected or coupled to", "contact or overlap", etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

FIG. 1 is a view schematically illustrating a system configuration of an organic light emitting display device according to embodiments of the disclosure.

An organic light emitting display device 100 according to embodiments of the disclosure may include the organic light emitting display device 100, a lighting device, or a light emitting device. For convenience of description, the following description focuses primarily on the organic light emitting display device 100. However, embodiments of the disclosure may also be applied to other various organic light emitting display devices 100, such as lighting devices or light emitting devices, as long as they include transistors.

The organic light emitting display device 100 according to embodiments of the disclosure may include a display panel (PNL) for displaying images or outputting light and a driving circuit for driving the display panel (PNL).

The organic light emitting display device 100 according to embodiments of the disclosure may be a bottom emission-type organic light emitting display device, which emits light toward the substrate on which light emitting elements are disposed, but the disclosure is not limited thereto. In some cases, the organic light emitting display device 100 of the disclosure may be a top emission-type electroluminescent display device, which emits light away from the substrate on which light emitting elements are disposed, or a dual emission-type electroluminescent display device which emits light towards and away from the substrate.

The display panel PNL may have a plurality of data lines DL and a plurality of gate lines GL. The display panel PNL may have a plurality of sub-pixels SP, coupled to a plurality of data lines DL and a plurality of gate lines GL, arranged in a matrix type.

In the display panel PNL, the plurality of data lines DL and the plurality of gate lines GL may be disposed to cross each other. For example, the plurality of gate lines GL may be arranged in rows or columns, and the plurality of data lines DL may be arranged in columns or rows. For ease of description, it is assumed below that the plurality of gate lines GL are arranged in rows, and the plurality of data lines DL are arranged in columns.

The display panel PNL may have other types of signal lines, as well as the plurality of data lines DL and the plurality of gate lines GL, depending on, e.g., the subpixel structure. The display panel PNL may further have a driving power line, a reference power line, or a common power line.

The type of the signal lines disposed on the panel PNL may be varied depending on, e.g., the subpixel structure. In this disclosure, the concept of signal line may encompass signal-applied electrodes.

The display panel PNL may include an active area AA for displaying pictures or images and a non-active area NA, in which no image is displayed, around the active area AA. The non-active area NA is also referred to as a bezel area.

The active area AA includes a plurality of subpixels SP for displaying images.

The non-active area NA has a pad area for electrical connection with a data driver DDR. The non-active area NA may have a plurality of data link lines to connect the pad area with the plurality of data lines DL. The plurality of data link lines may be extensions of the plurality of data lines DL to the non-active area NA or may be separate patterns electrically connected with the plurality of data lines DL.

The non-active area NA may also include gate driving-related lines to transfer voltage (signals) necessary for gate driving to a gate driver GDR through pads electrically connected with the data driver DDR. For example, the gate driving-related wires may include clock wires for transferring clock signals, gate power wires for transferring gate voltages VGH and VGL, and gate driving control signal wires for transferring various control signals necessary to generate scan signals. The gate driving-related lines are disposed in the non-active area NA, unlike the gate lines GL disposed in the active area AA.

The driving circuit may include the data driver DDR for driving the plurality of display device, the gate driver GDR for driving the plurality of gate lines GL, and a controller CTR for controlling the data driver DDR and the gate driver GDR.

The data driver DDR may drive the plurality of data lines DL by outputting data voltage to the plurality of data lines DL.

The gate driver GDR may drive the plurality of gate lines GL by outputting scan signals to the plurality of gate lines GL.

The controller CTR may control the driving operation of the data driver Data driver DDR and gate driver GDR by supplying various control signals DCS and GCS necessary for the driving operation of the data driver DDR and gate driver GDR. Further, the controller CTR may supply image data DATA to the data driver DDR.

The controller (CTR) starts scanning according to the timing implemented in each frame. The controller CTR converts input image data input from the outside into image data DATA suited for the data signal format used in the data driver DDR, outputs the image data DATA, and controls data driving at an appropriate time suited for scanning.

To control the data driver DDR and gate driver GDR, the controller CTR receives timing signals, such as a vertical sync signal Vsync, horizontal sync signal Hsync, input data enable signal (Data Enable (DE)), or clock signal CLK form the outside (e.g., a host system) and may generate various control signals. The controller CTR outputs the generated control signals to the data driver DDR and the gate driver GDR.

As an example, to control the gate driver GDR, the controller CTR outputs various gate control signals GCS including a gate start pulse GSP, a gate shift clock GSC, and a gate output enable signal (Gate Output Enable, GOE).

To control the data driver DDR, the controller CTR outputs various data control signals DCS including, e.g., a source start pulse SSP, a source sampling clock SSC, and a source output enable signal (Source Output Enable, SOE).

The controller CTR may be a timing controller used in a typical display technology. Alternatively, the controller CTR may be a control device capable of further performing other control functions including the timing controller.

The controller CTR may be implemented as a separate component from the data driver DDR. Alternatively, the controller CTR may be integrated with the data driver DDR in an integrated circuit.

The data driver DDR receives the image data DATA from the controller CTR and supply data voltage to the plurality of data lines DL, thereby driving the plurality of data lines DL. Here, the data driver DDR is also referred to as a source driver.

The data driver DDR may exchange various signals with the controller CTR via various interfaces.

The gate driver GDR sequentially drives the plurality of gate lines GL by sequentially supplying scan signals to the plurality of gate lines GL. Here, the gate driver GDR is also referred to as a scan driver.

The gate driver GDR sequentially supplies scan signals of On voltage or Off voltage to the plurality of gate lines GL under the control of the controller CTR.

When a specific gate line is opened by the gate driver GDR, the data driver DDR converts the image data DATA received from the controller CTR into an analog data voltage and supplies the analog data voltage to the plurality of data lines DL.

The data driver DDR may be positioned on one side (e.g., an upper or lower side) of the display panel PNL. However, embodiments of the disclosure are not limited thereto. For example, data drivers DDR may be positioned on both the sides (e.g., both the upper and lower sides) of the display panel PNL depending on a driving scheme or a display panel design scheme.

The gate driver GDR may be positioned on one side (e.g., a left or right side) of the display panel PNL. However, embodiments of the disclosure are not limited thereto. For example, gate drivers GDR may be positioned on both the sides (e.g., both the left and right sides) of the display panel PNL depending on a driving scheme or a display panel design scheme.

The data driver DDR may include one or more source driver integrated circuits (SDICs).

Each source driver integrated circuit (SDIC) may include a shift register, a latch circuit, a digital-to-analog converter (DAC), and an output buffer. In some cases, the data driver DDR may further include one or more analog-digital converters ADC.

Each source driver integrated circuit SDIC may be connected, in a tape automated bonding (TAB) type or chip-on-glass (COG) type, to the bonding pad of the display panel PNL. Alternatively, each source driver integrated circuit SDIC may be directly disposed on the display panel PNL. In some cases, each source driver integrated circuit (SDIC) may be integrated and disposed on the display panel PNL. Each source driver integrated circuit (SDIC) may be implemented in a chip-on-film (COF) type. In this case, each source driver integrated circuit SDIC may be mounted on a circuit film. Each source driver integrated circuit SDIC mounted on the circuit film may be electrically connected to the data lines DL of the display panel PNL through the circuit film.

The gate driver GDR may include a plurality of gate driving circuits GDC. The plurality of gate driving circuits may respectively correspond to the plurality of gate lines GL.

Each gate driving circuit GDC may include, e.g., a shift register and a level shifter.

Each gate driving circuit GDC may be connected, in a tape automated bonding (TAB) type or chip-on-glass (COG) type, to the bonding pad of the display panel PNL. Each gate driving circuit GDC may be implemented in a chip-on-film (COF) scheme. In this case, each gate driving circuit GDC may be mounted on a circuit film. Each gate driving circuit GDC mounted on the circuit film may be electrically connected to the gate lines GL of the display panel PNL through the circuit film. Each gate driving circuit GDC may be implemented in a gate-in-panel (GIP) type and be embedded in the display panel PNL. Accordingly, each gate driving circuit GDC may be directly formed on the display panel PNL.

Figure 2:
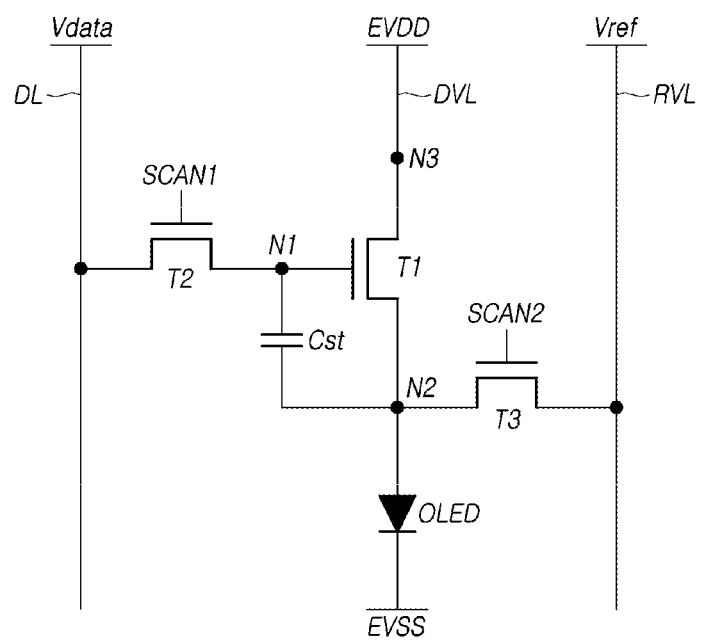
FIG. 2 is a view illustrating a structure of a subpixel SP when an organic light emitting display panel PNL is an organic light emitting diode (OLED) organic light emitting display panel according to embodiments of the disclosure.

FIG. 2 is a view illustrating a structure of a subpixel SP when an organic light emitting display panel PNL is an organic light emitting diode (OLED) organic light emitting display panel according to embodiments of the disclosure.

Referring to FIG. 2, each subpixel SP in the organic light emitting display panel PNL which is an OLED organic light emitting display panel may further include a second transistor T2 to transfer data voltage Vdata to a first node N1, which corresponds to a gate node of the driving transistor T1, and a storage capacitor Cst to maintain the data voltage Vdata corresponding to an image signal voltage or a voltage corresponding to the data voltage Vdata for the time of one frame.

The organic light emitting diode OLED may include a first electrode (an anode electrode or cathode electrode), an organic layer including at least one light emitting layer, and a second electrode (a cathode electrode or anode electrode).

As an example, a base voltage EVSS may be applied to the second electrode of the organic light emitting diode OLED.

The driving transistor T1 drives the organic light emitting diode OLED by supplying a driving current to the organic light emitting diode OLED.

The driving transistor T1 includes the first node N1, second node N2, and third node N3.

The "node" in the first to third nodes N1, N2, and N3 may mean a point, electrode(s), or wiring(s) having the same electrical state.

Each of the first node N1, the second node N2, and the third node N3 may include one or more electrodes.

The first node N1 of the driving transistor T1 is a node corresponding to a gate node, and may be electrically connected to a source node or a drain node of the second transistor T2.

The second node N2 of the driving transistor T1 may be electrically connected with the first electrode 301 of the organic light emitting diode OLED, and may be a source node or a drain node.

The third node N3 of the driving transistor T1 may be a node to which driving voltage EVDD is applied, be electrically connected with a driving voltage line DVL for supplying the driving voltage EVDD, and be the drain node or source node.

The driving transistor T1 and the second transistor T2 may be implemented as an n-type or a p-type.

The second transistor T2 may be electrically connected between the data line DL and the first node N1 of the driving transistor T1, and may be controlled by receiving the scan signal SCAN through the gate line and the gate node.

The second transistor T2 may be turned on by the scan signal SCAN to transfer the data voltage Vdata supplied from the data line DL to the first node N1 of the driving transistor T1.

The storage capacitor Cst may be electrically connected between the first node N1 and second node N2 of the driving transistor T1.

The storage capacitor Cst is an external capacitor intentionally designed to be outside the driving transistor T1, but not a parasite capacitor (e.g., Cgs or Cgd) which is an internal capacitor present between the first node N1 and the second node N2 of the driving transistor T1.

The third transistor T3 may be electrically connected between the second node N2 of the driving transistor T1 and the reference voltage line RVL and receive a second scan signal SCAN2 through the gate node to be controlled for its on/off.

The drain node or source node of the third transistor T3 may be electrically connected to the reference voltage line RVL, and the source node or drain node of the third transistor T3 may be electrically connected to the second node N2 of the driving transistor T1.

The third transistor T3 may be turned on, e.g., in a display driving time period and be turned on in a sensing driving time period for sensing the characteristic values of the driving transistor T1 or the characteristic values of the organic light emitting diode OLED.

In sync with a relevant driving timing (e.g., a display driving timing or an initialization timing in the sensing driving time period), the third transistor T3 may be turned by the second scan signal SCAN2, transferring the reference voltage Vref supplied to the reference voltage line RVL to the second node N2 of the driving transistor T1.

In sync with a relevant driving timing (e.g., a sampling timing in the sensing driving time period), the third transistor T3 may be turned on by the second scan signal SCAN2, transferring the voltage of the second node N2 of the driving transistor T1 to the reference voltage line RVL.

In other words, the third transistor T3 may control the voltage state of the second node N2 of the driving transistor T1 or may transfer the voltage of the second node N2 of the driving transistor T1 to the reference voltage line RVL.

The reference voltage line RVL may be electrically connected with an analog-to-digital converter that senses the voltage of the reference voltage line RVL, converts the voltage into a digital value, and outputs sensing data including the digital value.

The analog-to-digital converter may be included in the source driver integrated circuit SDIC that implements the data driver DDR.

The sensing data output from the analog-to-digital converter may be used to sense the characteristic values (e.g., threshold voltage or mobility) of the driving transistor T1 or the characteristic values (e.g., threshold voltage) of the organic light emitting diode OLED.

Each of the driving transistor T1, the second transistor T2, and the third transistor T3 may be an n-type transistor or a p-type transistor.

The first scan signal SCAN1 and the second scan signal SCAN2 may be separate gate signals. In this case, the first scan signal SCAN1 and the second scan signal SCAN2, respectively, may be applied to the gate node of the second transistor T2 and the gate node of the third transistor T3 through different gate lines.

In some cases, the first scan signal SCAN1 and the second scan signal SCAN2 may be the same gate signals. In this case, the first scan signal SCAN1 and the second scan signal SCAN2 may be jointly applied to the gate node of the second transistor T2 and the gate node of the third transistor T3 through the same gate line.

The structure of each subpixel illustrated in FIG. 2 is merely an example for description, and may further include one or more transistors or, in some cases, one or more storage capacitors.

The plurality of subpixels may have the same structure, or some of the plurality of subpixels may have a different structure.

Figure 3:
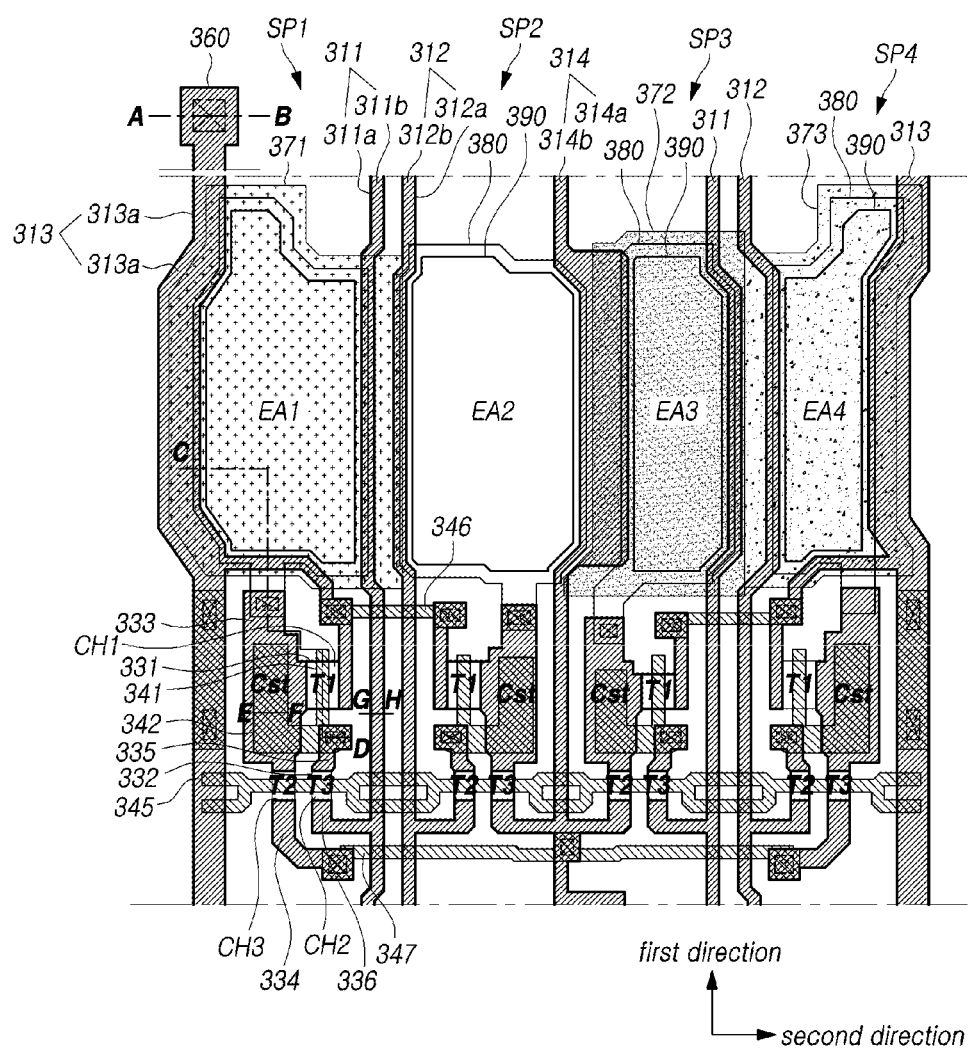
FIG. 3 is a plan view illustrating a partial area of subpixels disposed in an active area of an organic light emitting display device according to embodiments of the disclosure.

FIG. 3 is a plan view illustrating a partial area of subpixels disposed in an active area of an organic light emitting display device according to embodiments of the disclosure.

Referring to FIG. 3, a plurality of sub-pixels SP1, SP2, SP3, and SP4 may be disposed in the active area AA of the organic light emitting display device 100 according to embodiments of the disclosure. Each of the sub-pixels SP1, SP2, SP3, and SP4 may include at least one emission area EA1, EA2, EA3, and EA4 and at least one circuit area.

For example, a first sub-pixel SP1 may include a first emission area EA1 and a circuit area, a second sub-pixel SP2 may include a second emission area EA2 and a circuit area, a third sub-pixel SP3 may include a third emission area EA3 and a circuit area, and a fourth sub-pixel SP4 may include a fourth emission area EA4 and a circuit area.

The first subpixel SP1, the second subpixel SP2, the third subpixel SP3, and the fourth subpixel SP4 may be included in one pixel, but embodiment of the disclosure are not limited thereto. The organic light emitting diode display 100 according to embodiments of the disclosure may suffice as long as one pixel includes two or more subpixels.

The first emission area EA1 may be an area in which red light is emitted, the second emission area EA2 may be an area in which white light is emitted, the third emission area EA3 may be an area in which blue light is emitted, and the fourth emission area EA4 may be an area in which green light is emitted, but the disclosure is not limited thereto.

A first color filter 371 larger in area than the first emission area EA1 may be disposed in an area corresponding to the first emission area EA1. A second color filter 372 larger in area than the third emission area EA3 may be disposed in an area corresponding to the third emission area EA3. A third color filter 373 larger in area than the fourth emission area EA4 may be disposed in an area corresponding to the fourth emission area EA4.

No color filter may be disposed in an area corresponding to the second emission area EA2, but embodiments of the disclosure are not limited thereto.

The first color filter 371 may be a red color filter, the second color filter 372 may be a blue color filter, and the third color filter 373 may be a green color filter.

At least two emission areas among the first to fourth emission areas EA1, EA2, EA3, and EA4 may be different in size from each other and, in some cases, the first to fourth emission areas EA1, EA2, EA3, and EA4 may have the same size.

The bank 390 of the organic light emitting display device 100 according to embodiments of the disclosure may include emission areas EA1, EA2, EA3, and EA4 and a non-emission area.

The emission areas EA1, EA2, EA3, and EA4 may not overlap the bank 390, and the non-emission area may overlap the bank 390.

A circuit area for driving the organic light emitting diode (OLED) may be disposed in the non-emission area.

A plurality of signal lines, a plurality of transistors, and a storage capacitor Cst may be disposed in the circuit area.

Specifically, a first signal line 311, a second signal line 312, a third signal line 313, and a fourth signal line 314 may be disposed on the substrate 300.

The first to fourth signal lines 311, 312, 313, and 314 may be lines spaced apart from each other and extending in a first direction (e.g., a vertical direction).

The first and second signal lines 311 and 312 may be data lines, the third signal line 313 may be a driving voltage line, and the fourth signal line may be a reference voltage line. However, the type of the signal lines according to embodiments of the disclosure is not limited thereto.

Each of the first to fourth signal lines 311, 312, 313, and 314 may be formed of two layers.

For example, the first signal line 311 may include a layer 311b disposed on a layer 311a. The second signal line 312 may include a layer 312b disposed on a layer 312a. The third signal line 313 may include a layer 313b disposed on a layer 313a. The fourth signal line 314 may include a layer 314b disposed on a layer 314a.

A plurality of active layers 331 and 332 may be disposed on the substrate 300 where the first to fourth signal lines 311, 312, 313, and 314 are disposed.

The plurality of active layers 331 and 332 may be disposed on the same layer as the layers 311a, 312a, 313a, and 314a included in the first to fourth signal lines 311, 312, 313 and 314.

Each of the layers 311a, 312a, 313a, and 314a included in the first to fourth signal lines 311, 312, 313, and 314 and the plurality of active layers 331 and 332 may include at least one of zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO), but the disclosure is not limited thereto.

The layers 311b, 312b, 313b, and 314b included in the first to fourth signal lines 311, 312, 313, and 314, and first to third metal layers 333, 334, and 335 disposed on the plurality of active layers 331 and 332 may be disposed on the same layer as each other.

For example, the layers 311b, 312b, 313b, and 314b and the first to third metal layers 333, 334, and 335 may include any one of metals, such as aluminum (Al), gold (Au), silver (Ag), copper (Cu), tungsten (W), molybdenum (Mo), chromium (Cr), tantalum (Ta), or titanium (Ti) or alloys thereof. For example, it may be an alloy of molybdenum (Mo) and titanium (Ti), but embodiments of the disclosure are not limited thereto.

In other words, in the process of forming the first to fourth signal lines 311, 312, 313, and 314, the plurality of active layers 331 and 332 and the first to third metal layers 333, 334, and 335 may be simultaneously formed. Therefore, the process may be simplified.

Referring to FIG. 3, there may be include a pad electrode 360 electrically connected to the third signal line 313. The pad electrode 360 may be disposed in the non-active area NA.

Although only the pad electrode 360 electrically connected to the third signal line 313 is illustrated in FIG. 3, each of all the signal lines disposed in the active area AA may be electrically connected to the pad electrode disposed in the non-active area NA.

On the substrate 300 where the first to fourth signal lines 311, 312, 313, and 314, the plurality of active layers 331 and 332, and the first to third metal layers 333, 334, and 335 are disposed, an electrode pattern 341, a plate 342, a fifth signal line 345, a first extension 346, a second extension 347, and a first electrode 380 of an organic light emitting diode OLED may be disposed.

The electrode pattern 341, the plate 342, the fifth signal line 345, the first extension 346, the second extension 347, and the first electrode 380 of the organic light emitting diode OLED may contain the same material. In other words, the electrode pattern 341, the plate 342, the fifth signal line 345, the first extension 346, the second extension 347, and the first electrode 380 of the organic light emitting diode OLED may be formed by the same process.

Accordingly, the electrode pattern 341, the plate 342, the fifth signal line 345, the first extension 346, the second extension 347, and the first electrode 380 of the organic light emitting diode OLED may be formed using the same mask, so that the process may be simplified.

The fifth signal line 345 may extend in a second direction (e.g., a horizontal direction).

The fifth signal line 345 may be a scan line.

The first extension 346 may be electrically connected to the third signal line 313. The plurality of subpixels may receive a driving voltage through the first extension 346.

The second extension 347 may be electrically connected to the fourth signal line. The plurality of subpixels may receive a reference voltage through the second extension 347.

The electrode pattern 341 may overlap the first active layer 331.

The plate 342 may overlap the first metal layer 333, forming a storage capacitor Cst.

One first electrode 380 may overlap one entire emission area and may extend to a portion of the non-emission area.

The circuit area of each subpixel may include a first transistor T1, a second transistor T2, and a third transistor T3.

The first transistor T1 may be a driving transistor, the second transistor T2 may be a switching transistor, and the third transistor T3 may be a sensing transistor, but embodiments of the disclosure are not limited thereto.

The first transistor T1 may include a first active layer 331, a first metal layer 333, a third metal layer 335, and a first electrode pattern 341.

Each of the first and third metal layers 333 and 335 may contact a portion of the upper surface of the first active layer 331. The first and third metal layers 333 and 335 may serve as a source electrode and a drain electrode of the first transistor T1.

The first electrode 380 of the organic light emitting diode may be electrically connected to the first metal layer 333, and the third metal layer 335 may be electrically connected to the second transistor T2.

The electrode pattern 341 may serve as a gate electrode of the first transistor T1. The area where the electrode pattern 341 and the first active layer 331 overlap may be the first channel area CH1 of the first active layer 331.

The second transistor T2 may include a second active layer 332, a third metal layer 335, a branch area 336 of the first signal line 331, and a fifth signal line 345.

Each of the third metal layer 335 and the branch area 336 of the first signal line 331 may contact a portion of the upper surface of the second active layer 332. The third metal layer 335 and the branch area 336 of the first signal line 331 may serve as a source electrode and a drain electrode of the second transistor T2.

The fifth signal line 345 may serve as a gate electrode of the second transistor T2. The area where the fifth signal line 345 and the second active layer 332 overlap may be the second channel area CH2 of the second active layer 332.

The third transistor T3 may include the first active layer 331, the second metal layer 334, the third metal layer 335, and the fifth signal line 345.

The second metal layer 334 may contact a portion of the upper surface of the first active layer 331. The second metal layer 334 and the third metal layer 335 may serve as a source electrode and a drain electrode of the third transistor T3.

The fifth signal line 345 may serve as a gate electrode of the third transistor T3. The area where the fifth signal line 345 and the first active layer 331 overlap may be the third channel area CH3 of the first active layer 332.

The first active layer 331 may be an area in which at least a portion of the area other than the first and third channel areas CH1 and CH3 is conductive.

The second active layer 332 may be a conductive area which is at least a portion of the area other than the second channel area CH2.

The structure of the display device according to embodiments of the disclosure is described below in greater detail.

Figure 4:
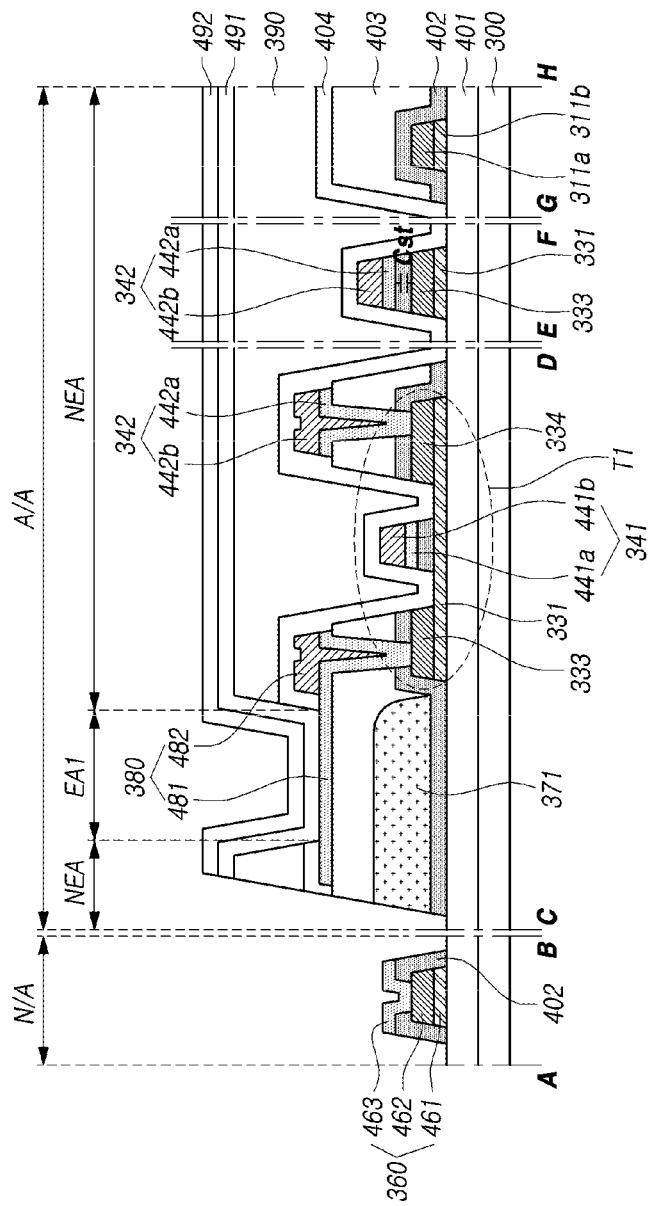
FIG. 4 is a cross-sectional view taken along line A-B, line C-D, and line E-F of FIG. 3.

FIG. 4 is a cross-sectional view taken along line A-B, line C-D, and line E-F of FIG. 3.

Referring to FIG. 4, the display device 100 according to embodiments of the disclosure may include a first insulation film 401 disposed on the substrate 30.

The first insulation film 401 may include an inorganic insulating material, such as silicon oxide (SiOx), silicon nitride (SiNx), or silicon oxynitride (SiON), but embodiments of the disclosure are not limited thereto.

Although FIG. 4 illustrates a structure in which the first insulation film 401 is a single layer, embodiments of the disclosure are not limited thereto, and the first insulation film 401 may have a multilayer structure. Further, in some cases, the first insulation film 401 may include an organic insulating material.

A first active layer 331, a first layer 331a of the first signal line 331, and a first pad electrode 461 may be disposed on the first insulation film 401.

Each of the first active layer 331, the first layer 331a of the first signal line 331, and the first pad electrode 461 may include at least one of zinc oxide (ZnO), zinc-tin oxide (ZTO), or zinc-indium oxide. (ZIO), indium oxide (InO), titanium oxide (TiO), indium-gallium-zinc oxide (IGZO), or indium-zinc-tin oxide (IZTO), but the disclosure is limited thereto.

The first active layer 331, the first layer 331a of the first signal line 331, and the first pad electrode 461 may be formed by the same process.

In the area where the first transistor T1 is positioned, a first metal layer 333 and a second metal layer 334 may be disposed on a portion of the upper surface of the first active layer 331.

As illustrated in FIG. 4, the first metal layer 333 may serve as an electrode of the storage capacitor Cst. In the area where the storage capacitor Cst is provided, the first active layer 331 may be disposed under the first metal layer 333.

Referring to FIG. 4, a second layer 311b including a metal may be disposed on the first layer 311a of the first signal line 311.

A second pad electrode 462 including a metal may be disposed on the first pad electrode 461 disposed in the non-active area NA.

The first metal layer 333, the second metal layer 334, the second layer 311b of the first signal line 311, and the second pad electrode 462 may be formed by the same process.

On the substrate 300 where the first metal layer 333, the second metal layer 334, the second layer 311b of the first signal line 311, and the second pad electrode 462 are disposed, a second insulation film 402 may be disposed.

The second insulation film 402 may include an inorganic insulating material, such as silicon oxide (SiOx), silicon nitride (SiNx), or silicon oxynitride (SiON), but embodiments of the disclosure are not limited thereto.

The second insulation film 402 may be disposed to expose a portion of the upper surface of the first active layer 331.

The area of the first active layer 331 that does not overlap the second insulation film 402 may be a conductive area.

A first color filter 371 may be disposed on the second insulation film 402.

The first color filter 371 may overlap the first emission area EA1.

A third insulation film 403 may be disposed on the substrate 300 where the first color filter 371 is disposed.

The third insulation film 403 may include an organic insulating material. The surface of the third insulation film 403 may be formed to be flat.

The third insulation film 403 may not overlap a portion of the first active layer 331.

Specifically, the third insulation film 403 may include a contact hole exposing a portion of the upper surface of the first metal layer 333 and the second metal layer 334 disposed on the first active layer 331.

The third insulation film 403 may expose the upper surface of the first active layer 331 in the area where the second insulation film 402 exposes the upper surface of the first active layer 331.

The third insulation film 403 may not be disposed in the area where the first metal layer 333 is used as an electrode of the storage capacitor Cst.

The first electrode 380 of the organic light emitting diode, the electrode pattern 341, the plate 342, and the third pad electrode 360 may be disposed on the substrate 300 where the third insulation film 403 is disposed.

The first electrode 380 of the organic light emitting diode may be disposed on the third insulation film 403 and contact the upper surface of the first metal layer 333 disposed on the first active layer 331 through the contact hole provided in the third insulation film 403.

A portion of the plate 342 may be disposed on the third insulation film 403 and contact the upper surface of the second metal layer 334 disposed on the first active layer 331 through another contact hole provided in the third insulation film 403. In other words, the plate 342 may be electrically connected to the second metal layer 334.

Another portion of the plate 342 may be disposed on the second insulation film 402 and overlap the first active layer 331 and the first metal layer 333, forming a storage capacitor Cst.

The electrode pattern 341 may be disposed on the first active layer 331 and the second insulation film 402. The electrode pattern 341 may serve as a gate electrode of the first transistor T1.

The non-active area NA may include a third pad electrode 463 disposed on the second insulation film 403.

The third pad electrode 463 may contact the upper surface of the second pad electrode 462 through the contact hole provided in the second insulation film 403.

The first electrode 380 of the organic light emitting diode OLED, the electrode pattern 341, the plate 342, and the third pad electrode 463 may be formed through the same mask.

The first electrode 380, the electrode pattern 341, and the plate 342 may be formed in a double-layer structure.

For example, as illustrated in FIG. 4, the first electrode 380, the plate 342, and the electrode pattern 341 may include lower layers 481, 441a, and 442a, respectively, and higher layers 482, 441b, and 442b, respectively.

The lower layers 481, 441a, and 442a and the third pad electrode 463 may include a transparent conductive material. For example, the lower layers 481, 441a, and 442a and the third pad electrode 463 may include any one of indium tin oxide (ITO), indium zinc oxide (IZO), and indium gallium zinc oxide (IGZO), but embodiments of the disclosure are not limited thereto.

The upper layers 482, 441b, and 442b may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but embodiments of the disclosure are not limited thereto.

Referring to FIG. 4, the upper layer 482 of the first electrode 380 may overlap a portion of the upper surface of the lower layer 481.

For example, the upper layer 482 of the first electrode 380 may overlap the lower layer 481 of the first electrode 380 in the non-emission area NEA but may not overlap in the emission area EA1.

In the electrode pattern 341, a fourth insulation film 404 and a bank 390 may be sequentially disposed on the substrate 300 where the first active layer 331 and the second insulation film 402 are disposed.

The fourth insulation film 404 and the bank 390 may be disposed in the active area AA except for the emission area.

The bank 390 may be a bank in black and may prevent light leakage caused by internal light.

In other words, the fourth insulation film 404 and the bank 390 may be disposed to expose a portion of the lower layer 481 of the first electrode 380.

A light emitting layer 491 of the organic light emitting diode OLED may be disposed on the substrate 300 where the bank 390 is disposed in the active area AA, and a second electrode 492 may be disposed on the light emitting layer 491.

As described above, in the display device according to embodiments of the disclosure, in the process of forming the first signal line 311, the first active layer 331, the first and second metal layers 333 and 334, and the first and second pad electrodes 461 and 462 may be formed, thus reducing the number of masks required for the process and simplifying the process.

Further, since the first electrode 380 of the organic light emitting diode OLED may be formed in the process of forming the electrode pattern 341, the plate 342, and the third pad electrode 463, it is possible to reduce the number of masks required for the process and simplify the process.

Although FIG. 4 illustrates only a portion of the first emission area EA1 and the circuit area electrically connected with the first emission area EA1, the third emission area EA3 and the circuit area electrically connected with the third emission area EA3 and the fourth emission area EA4 and the circuit area electrically connected with the fourth emission area EA4 may also have the same structure as that of FIG. 4.

Further, the second emission area EA2 and the circuit area electrically connected with the second emission area EA2 may have the same structure as the structure of FIG. 4 with the first color filter 317 excluded.

The process of forming the first electrode 380 of the organic light emitting diode OLED, the electrode pattern 341, the plate 342, and the third pad electrode 463 is described below.

FIGS. 5 to 13 are views schematically illustrating a process for forming a first electrode, an electrode pattern, a plate, and a third pad electrode of an organic light emitting diode.

Figure 5:
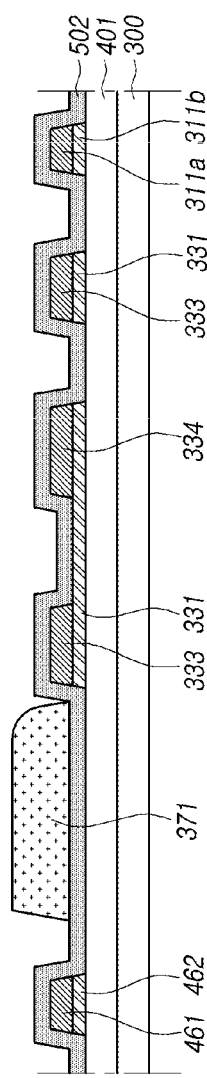
FIGS. 5, 6, 7, 8, 9, 10, 11, 12, and 13 are views schematically illustrating a process for forming a first electrode, an electrode pattern, a plate, and a third pad electrode of an organic light emitting diode.

Referring to FIG. 5, a first insulation film 401 may be formed on a substrate 300.

A first signal line 311, a first active layer 331, first and second metal layers 333 and 334, and first and second pad electrodes 461 and 462 may be formed on the first insulation film.

A second insulation film material 502, partially patterned, may be formed on the substrate where the first signal line 311, the first active layer 331, the first and second metal layers 333 and 334, and the first and second pad electrodes 461 and 462 are formed.

A first color filter 371 may be disposed on a portion of the upper surface of the second insulation film material 502.

Figure 6:
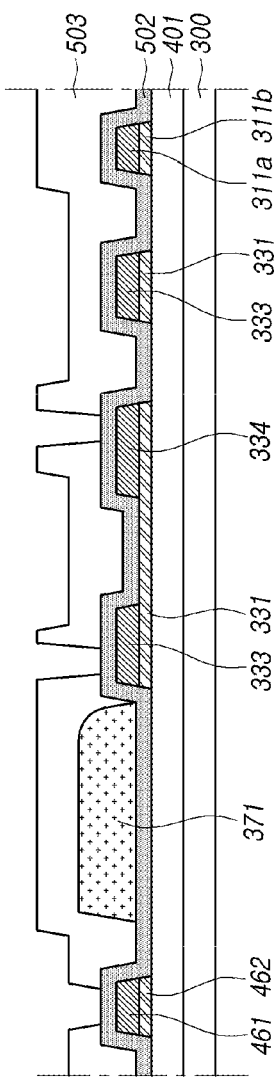

Referring to FIG. 6, a third insulation film material 503, partially patterned, may be disposed on the substrate 300 where the first color filter 371 is disposed.

The third insulation film material 503 may include a hole overlapping a portion of the upper surface of each of the first metal layer 533, the second metal layer 534, and the second pad electrode 462.

The third insulation film material 503 disposed in the area that overlaps the non-active layer NA and the first active layer 331 but does not overlap the first and second metal layers 333 and 334 may be smaller in height than the third insulation film material 503 disposed in the remaining area.

Figure 7:
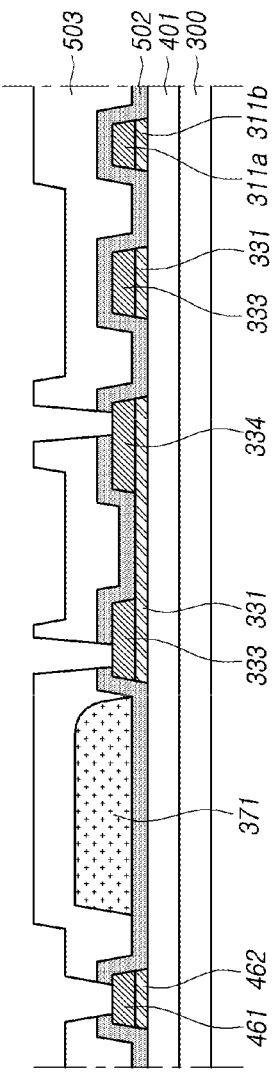

Referring to FIG. 7, the second insulation film material 502 may be patterned through a dry etching process using the third insulation film material 503 as a mask.

Specifically, the second insulation film material 502 may be removed in the area corresponding to the hole of the third insulation film material 503. Thus, the second insulation film material 502 may include a hole in the area overlapping a portion of the upper surface of each of the first metal layer 533, the second metal layer 534, and the second pad electrode 462.

Referring to FIG. 7, the second insulation film material 502 may be formed to expose a portion of the upper surface of the first metal layer 333, a portion of the second metal layer 334, and a portion of the upper surface of the second pad electrode 462.

Figure 8:
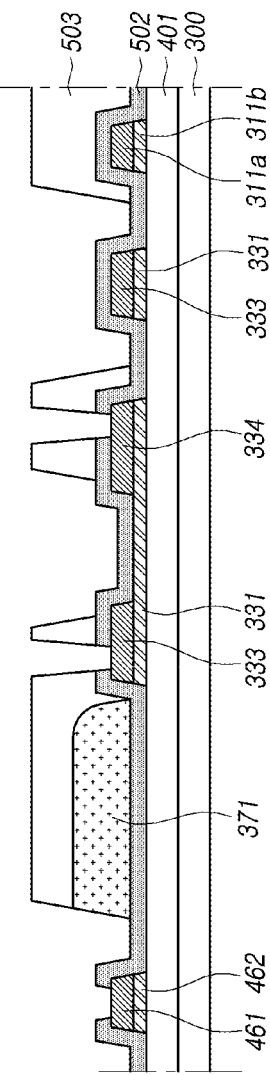

Referring to FIG. 8, the third insulation film material 503 disposed in the area that overlaps the non-active layer NA and the first active layer 331 but does not overlap the first and second metal layers 333 and 334 may be removed through an ashing process.

Referring to FIG. 8, the third insulation film material 503, together with the second insulation film material 503, may be formed to expose a portion of the upper surface of the first metal layer 333, a portion of the second metal layer 334, and a portion of the upper surface of the second pad electrode 462.

Further, the third insulation film material 503 may be wholly removed on the second pad electrode 462.

Further, the third insulation film material 503 may be formed not to be disposed on a portion of the upper surface of the first active layer 333. Specifically, as illustrated in FIG. 5, at cross-sectional view, the third insulation film material 503 may not be disposed in the area between the first metal layer 333 and the second metal layer 334.

Further, the third insulation film material 503 may not be disposed on the area where the second metal layer 334 serves as an electrode of the storage capacitor Cst.

Figure 9:
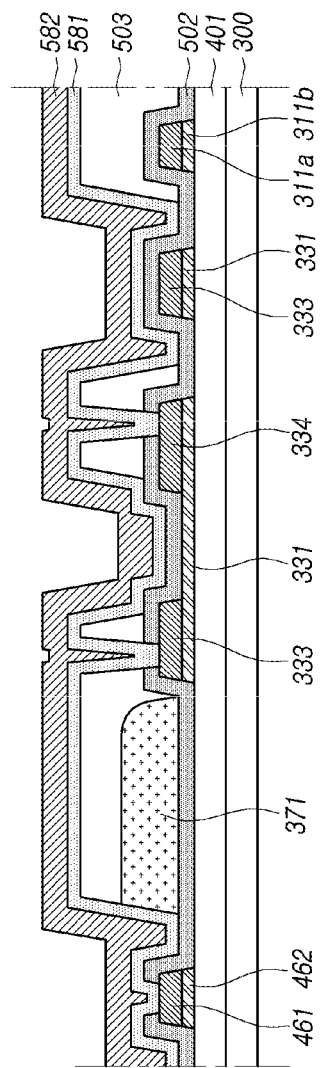

Referring to FIG. 9, a lower layer material 581 may be disposed on the substrate 300 where the third insulation film material 503 is formed, and an upper layer material 582 may be disposed on the lower layer material 581.

Figure 10:
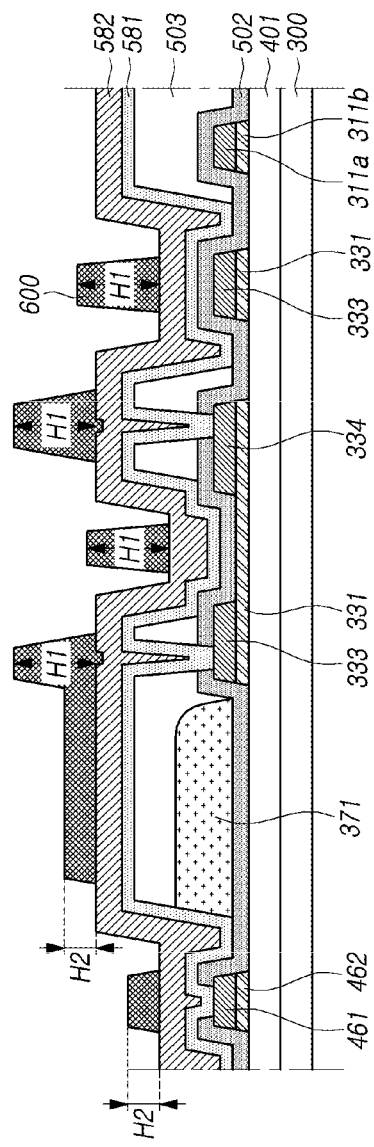

Thereafter, as illustrated in FIG. 10, a photoresist pattern 600 may be disposed.

The photoresist pattern 600 may be disposed on the first and second pad electrodes 461 and 462.

The photoresist pattern 600 may overlap the first color filter 371 and overlap the first metal layer 333.

At cross-sectional view, the photoresist pattern 600 may be disposed in the area where the third insulation film material 503 is not disposed in the area between the first metal layer 333 and the second metal layer 334.

The photoresist pattern 600 may overlap the second metal layer 334.

Further, the photoresist pattern 600 may be disposed on the area where the second metal layer 334 serves as an electrode of the storage capacitor Cst.

Referring to FIG. 10, the height H1 of the photoresist pattern 600 in the area overlapping the first metal layer 333, the height H1 of the photoresist pattern 600 disposed on the area where the third insulation film material 503 is not disposed between the first metal layer 333 and the second metal layer 334, the height H1 of the photoresist pattern 600 disposed in the area overlapping the second metal layer 334, and the height H1 of the photoresist pattern 600 disposed on the area where the second metal layer 334 serves as an electrode of the storage capacitor Cst may correspond to each other.

The height H2 of the photoresist pattern 600 disposed on the first and second pad electrodes 461 and 462 and the height H2 of the photoresist pattern 600 overlapping the first color filter 371 may correspond to each other.

The height H1 may be larger than the height H2.

Figure 11:
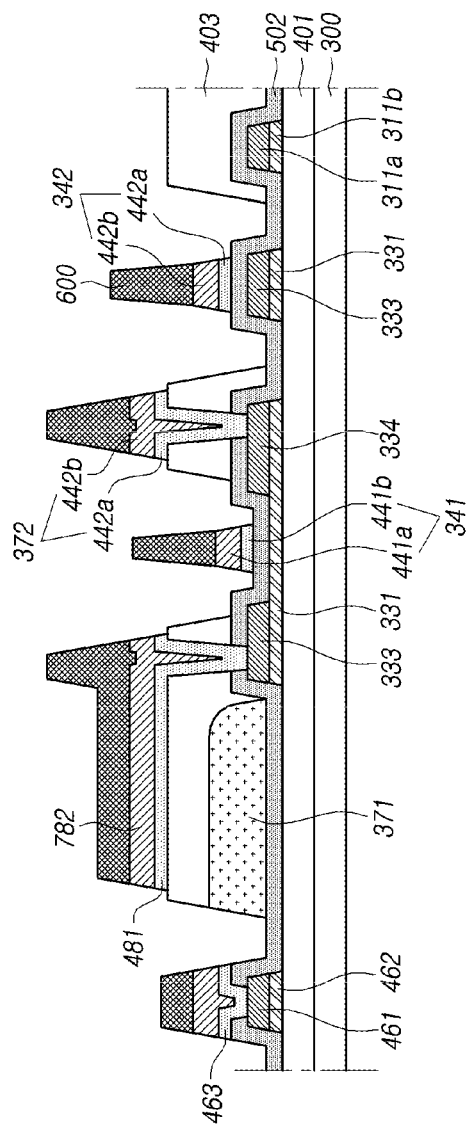

Thereafter, as illustrated in FIG. 11, the lower layer material 581 and the upper layer material 582 may be etched using the photoresist pattern 600 as a mask.

Specifically, as illustrated in FIG. 11, the lower layer material 581 and upper layer material 582 not overlapping the photoresist pattern 600 may be removed.

Further, the third insulation film material may become the third insulation film 403.

Figure 12:
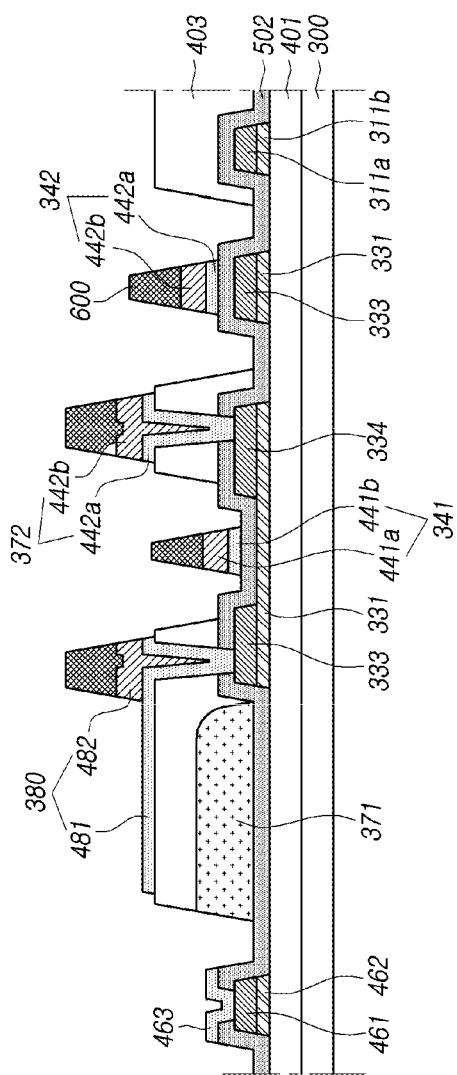

Thereafter, as illustrated in FIG. 12, the photoresist pattern 600 may be etched.

Specifically, referring to FIGS. 11 and 12, a portion of the photoresist pattern 600 may be removed with a height H2, and the photoresist pattern 600 remained on the substrate 300 may have a height H1, but, as shown in FIG. 8, its height may be smaller than the height H1.

As illustrated in FIG. 12, the photoresist pattern 600 remains in the area overlapping the first metal layer 333, the area between the first metal layer 333 and the second metal layer 334, the area overlapping the second metal layer 334, and the area where the second metal layer 334 serves as an electrode of the storage capacitor Cst.

Thereafter, the upper layer material may be etched using an etchant and the photoresist pattern 600 as a mask.

In this case, as illustrated in FIG. 12, as the upper and side surfaces of the first active layer 331 and the components disposed on the same layer as the first active layer 331 are surrounded by the second insulation film material 402, the first active layer 331 and the components disposed on the same layer as the first active layer 331 may be prevented from damage by the etchant used for etching the upper layer material.

In this process, the upper layer material disposed in the area overlapping the photoresist pattern 600 may remain on the substrate 300, and the upper layer material disposed in the area that does not overlap the photoresist pattern 600 may be removed.

Figure 13:
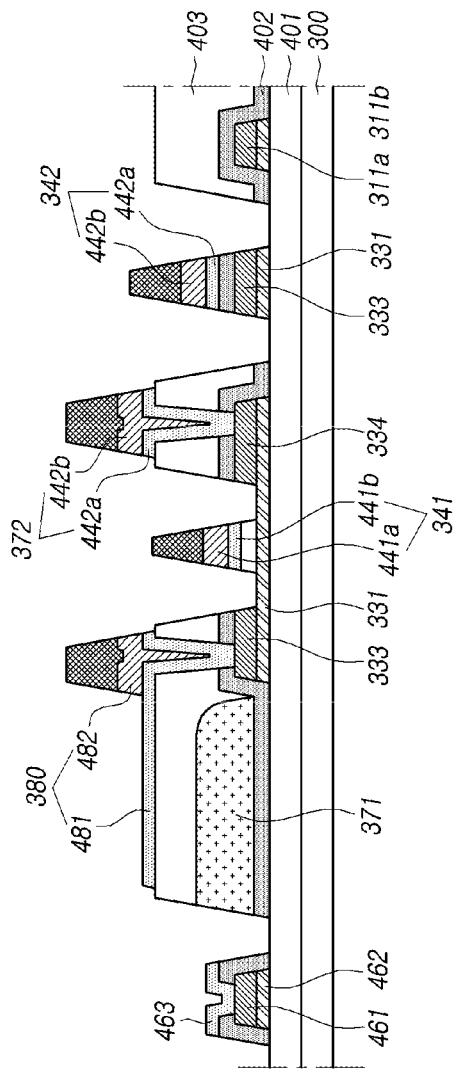

Thereafter, as illustrated in FIG. 13, the second insulation film material may be partially etched through a dry etching process.

Thus, the second insulation film 402 may be formed to expose a portion of the upper surface of the first active layer 331.

The area of the first active layer 331 that does not overlap the second insulation film 402 may be rendered conductive due to the dry etching process.

The area where the first active layer 331 overlaps the electrode pattern 341 may be a first channel area of the first active layer 331.

The conductive area of the first active layer 331 may contact and electrically connect to the first and second metal layers 331 and 334.

Thereafter, the whole photoresist pattern 600 existing on the substrate 300 may be removed.

Through this process, the first electrode 380 of the organic light emitting diode OLED, the electrode pattern 341, the plate 342, and the third pad electrode 463 may be formed.

The display device 100 according to embodiments of the disclosure may be formed through a first mask used to form the first and second active layers 331 and 332, the respective first layers of the first to fourth signal lines 311, 312, 313, and 314, and the first pad electrode 461, a second mask used to form the first to third metal layers 333, 334, and 335, the respective second layers of the first to fourth signal lines 311, 312, 313, and 314, and the first pad electrode 462, a third mask used to form the second insulation film 402, a fourth mask used to form the color filters 317, 318, and 319, a fifth mask used to form the third insulation film 403, a sixth mask used to form the first electrode 380 of the organic light emitting diode OLED, the fifth signal line 345, the electrode pattern 341, and the plate 342, and a seventh mask used to form the fourth insulation film 404 and the bank 390.

Meanwhile, in the display device 100 according to embodiments of the disclosure, the fifth signal line is disposed on the same layer as the first electrode 380 of the organic light emitting diode OLED, thereby reducing the probability of damage.

This is discussed below with reference to FIGS. 14 and 15.

Figure 14:
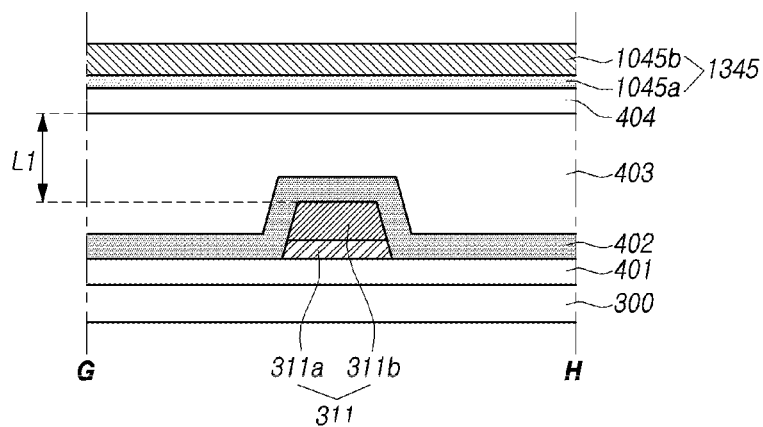
FIG. 14 is a cross-sectional view taken along line G-H of FIG. 4.

FIG. 14 is a cross-sectional view taken along line G-H of FIG. 4. FIG. 15 is a cross-sectional view illustrating a position of a fifth signal line according to a comparative example.

Referring to FIG. 14, a display device 100 according to embodiments of the disclosure may include a first insulation film 401, a first signal line 311, a second insulation film 402, a third insulation film 403, a fourth insulation film 404, and a fifth signal line 345.

Specifically, the first insulation film 401 may be disposed on the substrate 300, and the first signal line 311 including a first layer 311a and a second layer 311b may be disposed on the first insulation film 401.

The second insulation film 402, the third insulation film 403, and the fourth insulation film 404 may be sequentially disposed on the first signal line 311.

The fifth signal line 345 may be disposed on the fourth insulation film 404.

The fifth signal line 345 may include a lower layer 1045a disposed on the fourth insulation film 404 and an upper layer 1045b disposed on the lower layer 1045a.

The lower layer 1045a of the fifth signal line 345 may be disposed on the same layer as the respective lower layers 481 and 442a of the first electrode 380 and the plate 342 of FIG. 4.

The upper layer 1045b of the fifth signal line 345 may be disposed on the same layer as the respective upper layers 482 and 442b of the first electrode 380 and the plate 342 of FIG. 4.

As illustrated in FIG. 14, the fifth signal line 345 is disposed on the third insulation film 403 with a flat surface, so that the surface of the fifth signal line 345 may be formed to be flat despite being disposed to overlap the first signal line 311.

Figure 15:
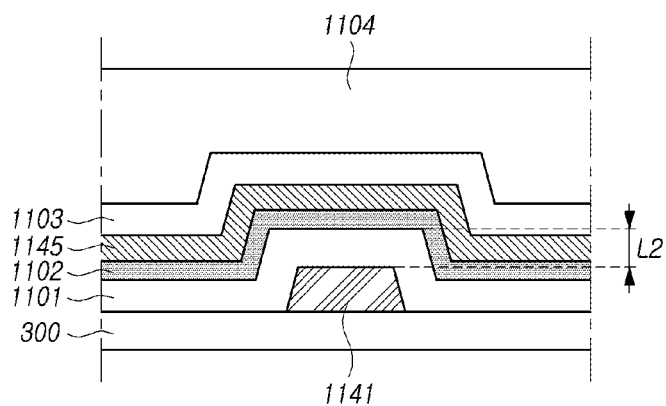
FIG. 15 is a cross-sectional view illustrating a position of a fifth signal line according to a comparative example.

Referring to FIG. 15, the display device according to the comparative example may include a data line 1141, a first insulation film 1101, a second insulation film 1102, a gate line 1145, an inter-layer insulation film 1103, and an overcoat layer 1104.

Specifically, as illustrated in FIG. 15, the data line 1141 may be disposed on the substrate 300.

The first and second insulation films 1101 and 1102 including an inorganic insulating material may be sequentially disposed on the data line 1141.

The first and second insulation films 1101 and 1102 may have a surface shape that conforms to the shape of the surface of the substrate 300 where the data line 1141 is disposed.

The gate line 1145 may be disposed on the second insulation film 1102.

The gate line 1145 is also formed to conform to the surface shape of the second insulation film 1102, and thus may be formed to have at least one step.

The inter-layer insulation film 1103 including an inorganic insulating material and the overcoat layer 1104 including an organic insulating material may be disposed on the gate line 1145.

Although not shown in FIG. 15, a first electrode of an organic light emitting diode may be disposed on the overcoat layer 1104.

As the gate line 1145 is disposed on a different layer than the first electrode of the organic light emitting diode and has a structure disposed to overlap other signal lines (e.g., data lines), the gate line 1145 may be formed to have at least one step.

When a stress is applied to the gate line 1145, the stress is concentrated on the area where the step of the gate line 1145 is provided, so that the gate line 1145 may be easily damaged.

In contrast, as illustrated in FIG. 14, in the display device according to embodiments of the disclosure, the fifth signal line 345 is formed to be flat without a step even in the area overlapping the first signal line 311. Thus, although stress is applied to the fifth signal line 345, the fifth signal line 345 has no portion where the stress is focused, and is thus capable of robust design.

The distance L1 between the first signal line 311 and the fifth signal line 345 of FIG. 14 (the sum of the heights of the second insulation film 402, the third insulation film 403, and the fourth insulation film 404) may be larger than the distance L2 between the data line 1141 and the gate line 1145 of FIG. 11 (the sum of the heights of the first insulation film 1101 and the second insulation film 1101).

In other words, as a sufficient distance L1 is secured between the first signal line 311 and the fifth signal line 345, it is possible to reduce the parasitic capacitance generated between the first signal line 311 and the fifth signal line 345.

Although the description made above in connection with FIGS. 1 to 14 focuses primarily on the structure in which the second insulation film 402 exposes a portion of the upper surface of the first active layer 331, the structure of the display device 100 according to embodiments of the disclosure is not limited thereto.

Figure 16:
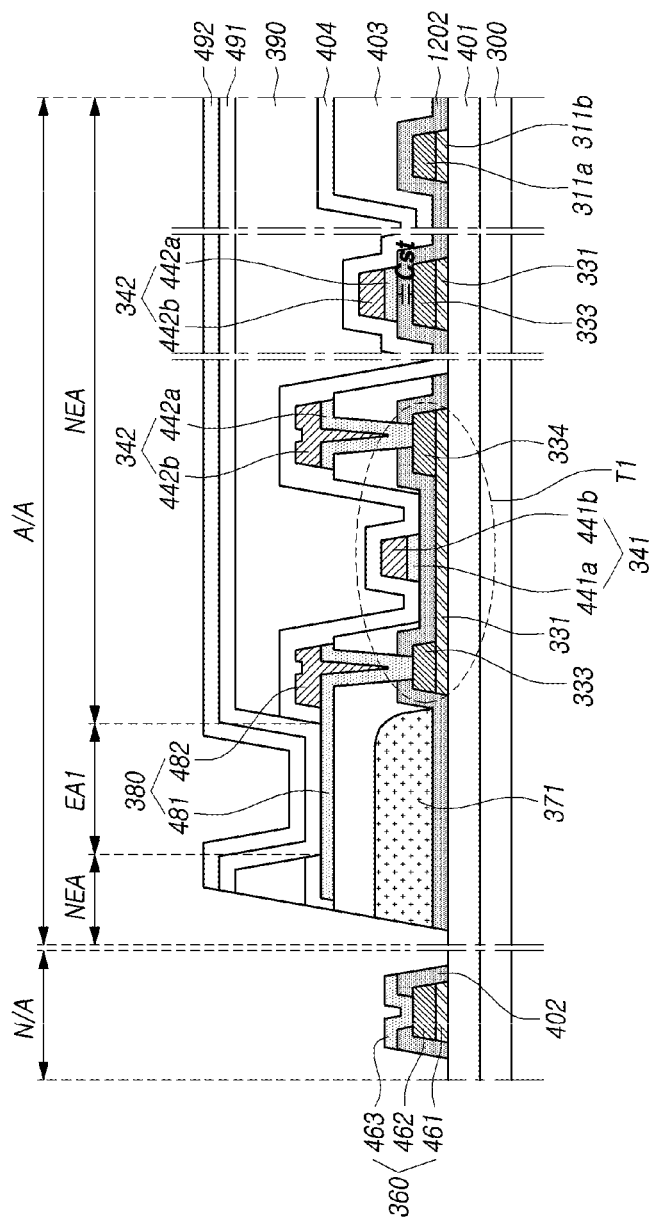
FIG. 16 is a cross-sectional view illustrating a structure of a display device according to embodiments of the disclosure.

FIG. 16 is a cross-sectional view illustrating a structure of a display device according to embodiments of the disclosure.

Substantially the same configurations and effects as those described above are not repeatedly described below. In the following description, the same reference numbers may be used to denote the same elements or components as those described in the above embodiments.

Referring to FIG. 16, the second insulation film 402 may overlap the entire upper surface and the entire side surface of the first active layer 331 in the area between the first metal layer 333 and the second metal layer 334.

In other words, the second insulation film 402 may be disposed to surround the entire first active layer 331.

In this case, the first active layer 331 may be doped in the remaining area except for the channel area through a separate doping process instead of the dry etching process of the second insulation film 402.

The structure of the display device 100 according to embodiments of the disclosure is not limited thereto, and components for protecting characteristics of transistors disposed on the substrate 300 may be further included.

This is described below with reference to FIGS. 17 and 18.

Figure 17:
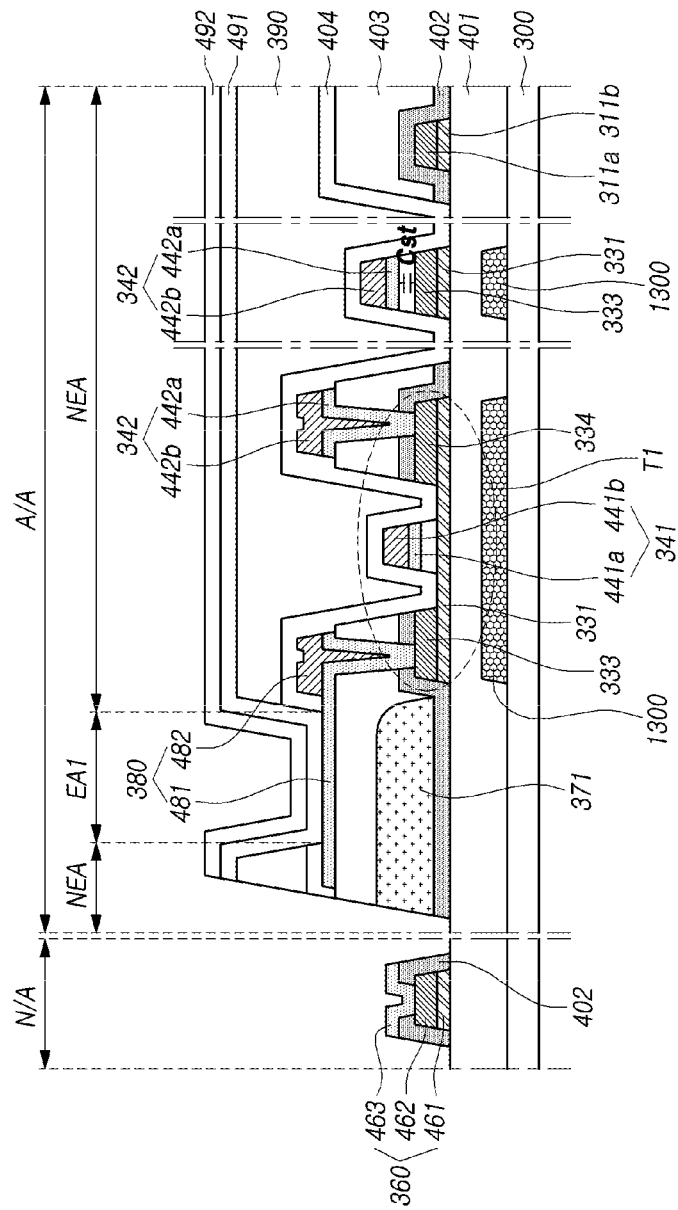
FIGS. 17 and 18 are cross-sectional view schematically illustrating a structure of a display device according to embodiments of the disclosure.
Figure 18:
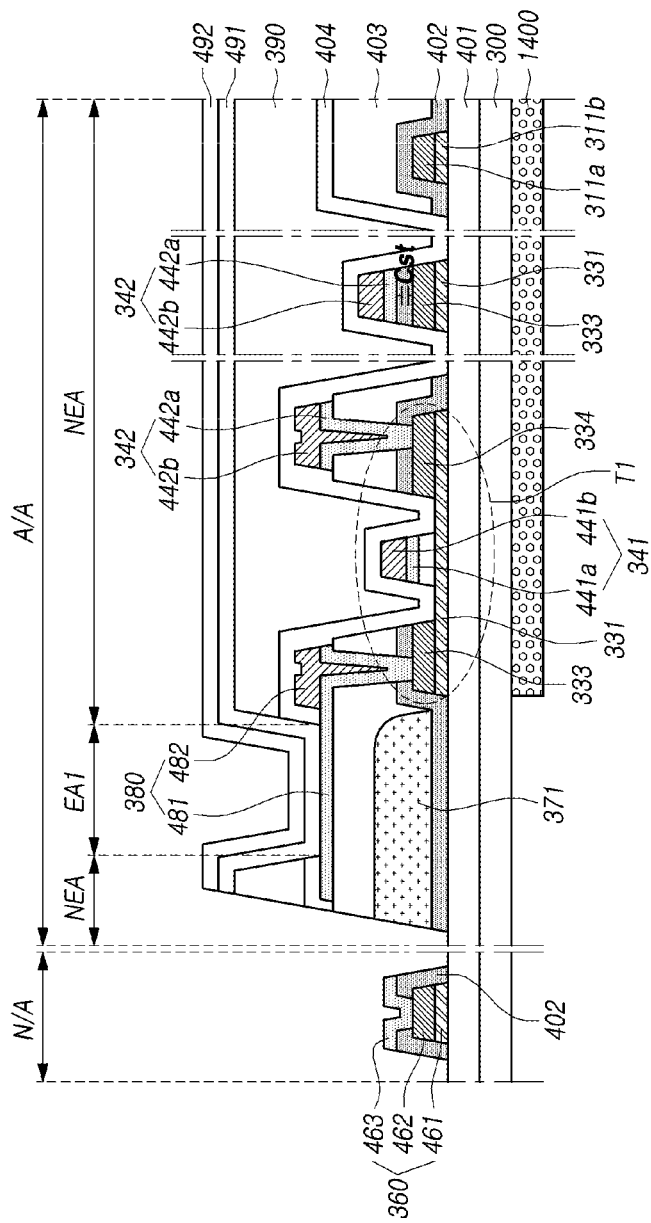

FIGS. 17 and 18 are cross-sectional view schematically illustrating a structure of a display device according to embodiments of the disclosure.

Substantially the same configurations and effects as those described above are not repeatedly described below. In the following description, the same reference numbers may be used to denote the same elements or components as those described in the above embodiments.

Referring to FIG. 17, a light blocking layer 1300 may be disposed under the plurality of active layers 331 disposed in the active area AA of the display device 100 according to embodiments of the disclosure.

The light blocking layer 1300 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but embodiments of the disclosure are not limited thereto.

The light blocking layer 1300 may be disposed on the substrate 300, and at least one layer of first insulation film 401 may be disposed on the light blocking layer 1300.

A first active layer 331, a first layer 331a of the first signal line 331, and a first pad electrode 461 may be disposed on the first insulation film 401.

As illustrated in FIG. 17, the light blocking layer 1300 may overlap the entire first active layer 331.

However, the structure of the light blocking layer 1300 according to embodiments of the disclosure is not limited thereto, and the light blocking layer 1300 may be disposed only in the area overlapping the channel areas of the first active layer 331.

Referring to FIG. 17, the light blocking layer 1300 may not overlap the emission area EA1. Accordingly, when the organic light emitting diode OLED emits light toward the substrate 300, the light from the organic light emitting diode OLED may not be absorbed but emitted to the outside by the light blocking layer 1300.

Further, although not shown in FIG. 17, an additional light blocking layer 1300 overlapping the second active layer 332 may be disposed.

Accordingly, it is possible to prevent changes in the characteristics of the first to third transistors T1, T2, and T3 when light is incident on the first and second active layers 331 and 332.

Referring to FIG. 18, to prevent the light incident from the rear surface of the substrate 300 from reaching the first and second active layers 331 and 332, a light blocking film 1400 may be attached to the rear surface of the substrate 300.

The light blocking film 1400 may overlap a portion of the active area AA.

For example, as illustrated in FIG. 18, the light blocking film 1400 may not overlap the emission area EA1 in the active area AA but may overlap the non-emission area NEA.

Accordingly, it is possible to prevent the light emitted from the organic light emitting diode OLED from being incident on the active layers 331 and 332 while being simultaneously directed to the outside.

Further, in addition to the structure of FIG. 4, the display device 100 according to embodiments of the disclosure may include a structure that may prevent light leakage due to propagation of light to different subpixels or changes in the characteristics of the transistor as the light is incident on the driving transistor.

This is described below with reference to FIGS. 19 and 20.

Figure 19:
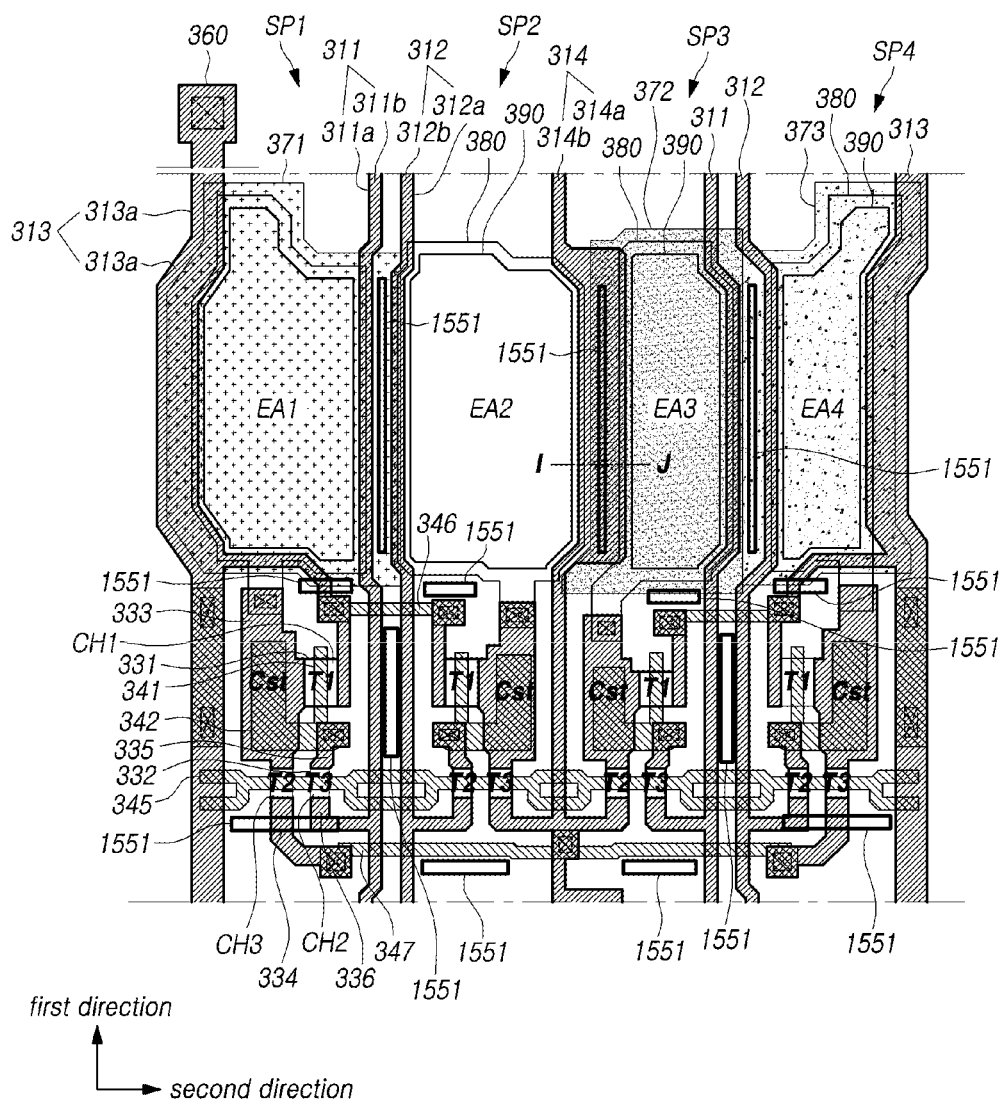
FIG. 19 is a plan view illustrating a structure capable of preventing light leaks in an active area in a display device according to embodiments of the disclosure.

FIG. 19 is a plan view illustrating a structure capable of preventing light leaks in an active area in a display device according to embodiments of the disclosure. FIG. 20 is a cross-sectional view taken along line I-J of FIG. 19.

Substantially the same configurations and effects as those described above are not repeatedly described below. In the following description, the same reference numbers may be used to denote the same elements or components as those described in the above embodiments.

Figure 20:
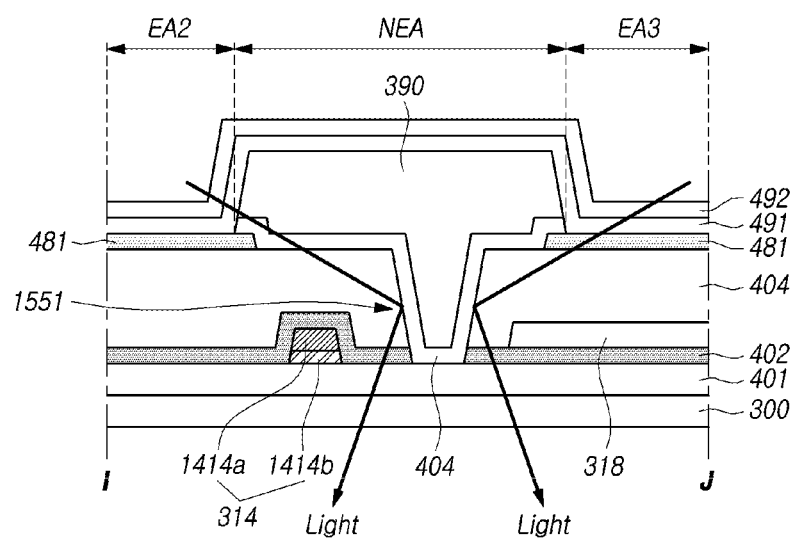
FIG. 20 is a cross-sectional view taken along line I-J of FIG. 19.

Referring to FIGS. 19 and 20, the display device 100 according to embodiments of the disclosure may include a plurality of slits 1551 of the third insulation film 403, provided in the non-emission area NEA.

As illustrated in FIG. 20, the slit 1551 of the third insulation film 403 may overlap the slit formed in the second insulation film 402 to expose a portion of the upper surface of the first insulation film 401.

A fourth insulation film 404 and a bank 390 may fill the slit 1551 of the third insulation film 403 and the slit of the second insulation film 402.

Part of the light emitted from the organic light emitting diode may propagate to the third insulation film 403 and go over to other subpixels emitting different colors of light. However, in the display device according to embodiments of the disclosure, the light emitted from the organic light emitting diode may meet the fourth insulation film 404 provided in the slit of the second insulation film and the slit 1551 of the third insulation film 404 and be refracted due to a difference in refractive index between the third and fourth insulation films 403 and 404 and thus be prevented from traveling over to other subpixels emitting different colors of light.

Accordingly, it is possible to prevent light leakage between subpixels emitting different colors of light.

As illustrated in FIG. 19, not only between different emission areas (e.g., between the first and second emission areas or between the second and third emission areas) is provided the slit 1551 of the third insulation film 403, but the slit 1551 may also be provided around the first transistor T1.

For example, as illustrated in FIG. 19, the slit 1551 of the third insulation film 403 may be provided to correspond to at least three side surfaces of the first channel area CH1 of the first active layer 331.

Referring to FIG. 19, the slit 1551 of the third insulation film 403 may be provided to correspond to at least three side surfaces of the first channel area CH1 of the first active layer 331 of the first transistor T1 disposed in the first to fourth subpixels SP1, SP2, SP3, and SP4.

Thus, it is possible to prevent changes in the electrical characteristics of the first transistor T1 as the light emitted from the emission areas EA1, EA2, EA3, and EA4 of each subpixel is incident on the first channel area CH1 of the first transistor T1.

Referring to FIG. 19, some of the plurality of slits 1551 of the third insulation film 403 may be disposed between the first extension 346 and the emission areas EA1, EA2, EA3, and EA4.

Further, some of the plurality of slits 1551 of the third insulation film 403 may be disposed between the first signal line 311 and the second signal line 312.

Further, some of the plurality of slits 1551 of the third insulation film 403 may overlap the second metal layer 334 and be disposed in the area between the fifth signal line 345 and the second extension 347.

Further, some of the plurality of slits 1551 of the third insulation film 403 may be disposed between the second extension 345 and the second and third emission areas EA2 and EA3.

Referring to FIG. 19, as the first electrode 380 of the organic light emitting diode OLED and the electrode pattern 341 serving as the gate electrode of the first transistor T1 are formed in the same process, they need a spacing X not to contact each other.

Accordingly, the distance between the opening (area that does not overlap the bank) of the subpixel and the electrode pattern 341 may increase. Accordingly, the distance between the first transistor T1 and the emission areas EA1, EA2, EA3, and EA4 may increase, and the chance of preventing degradation of the characteristics of the first transistor T1 due to the light emitted from the emission areas EA1, EA2, EA3, and EA4 may increase as much.

Figure 21:
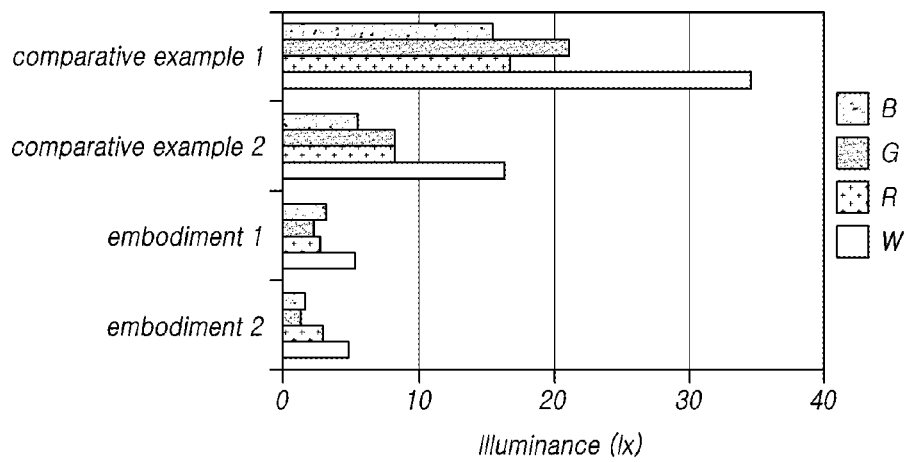
FIG. 21 is a graph illustrating the amount of light incident on a driving transistor (e.g., a first transistor) of a display device according to embodiments of the disclosure and the amount of light incident on a driving transistor of a display device according to comparative examples.

FIG. 21 is a graph illustrating the amount of light incident on a driving transistor (e.g., a first transistor) of a display device according to embodiments of the disclosure and the amount of light incident on a driving transistor of a display device according to comparative examples.

In FIG. 21, the display device according to comparative example 1 may have a structure of lacking the light blocking layer under the active layer of the driving transistor in the display device having the structure of FIG. 15.

The display device according to comparative example 2 may have a structure of having a light blocking layer under the active layer of the driving transistor in the display device having the structure of FIG. 15.

The display devices according to comparative examples 1 and 2 may have a structure in which the gate electrode of the driving transistor and the scan line are disposed under the overcoat layer, and the first electrode of the organic light emitting diode is disposed on the overcoat layer.

The display device according to embodiment 1 of FIG. 21 may have the structure of FIG. 3, and the display device according to embodiment 2 may have the structure of FIG. 19.

Referring to FIG. 21, the amount of light incident on the driving transistor disposed in each of the subpixels R, G, B, and W of the display devices according to comparative examples 1 and 2 may be larger than the amount of light incident on the driving transistor disposed in each of the subpixels R, G, B, and W of the display devices according to embodiments 1 and 2.

In other words, the display device according to embodiments of the disclosure may simplify the process and reduce the amount of internal light incident on the driving transistor disposed in each subpixel, so that it is possible to prevent changes in the characteristics of the driving transistor due to the internal light.

According to embodiments of the disclosure, the active layer, the plurality of signal lines, and the pad electrode may be formed in the same process, and the first electrode of the organic light emitting diode, at least one signal line, electrode pattern, plate, and pad electrode may be formed in the same process, so that it is possible to provide a display panel and display device capable of simplifying the process and reducing the number of masks required for the process.

Embodiments of the disclosure relate to a display panel and display device capable of preventing degradation of the characteristics of the driving transistor by preventing the internal light from reaching the channel area of the driving transistor through multiple slits provided in the third insulation film and by increasing the distance between the opening and the driving transistor.

Embodiments of the disclosure may provide a display panel and display device capable of preventing damage to a signal line due to a step in components disposed under the signal line as at least one signal line is disposed on the same layer as the first electrode of the organic light emitting diode OLED.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles described herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope understandable by a person skilled in the art based on the embodiments described herein. The scope of protection of the disclosure should be construed based on the following claims, and all technical ideas within the scope of equivalents thereof should be construed as being included within the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate;
first, second, third, and fourth signal lines and an active layer disposed on the substrate, the first, second, third, and fourth signal lines spaced apart from each other;
a first metal layer and a second metal layer disposed on a portion of an upper surface of the active layer and spaced apart from each other;
a first insulation film disposed on the first and second metal layers;

a second insulation film disposed on the first insulation film and overlapping at least a portion of the first and second metal layers disposed on the active layer, overlapping the first, second, third, and fourth signal lines, and offsetting from a portion of the upper surface of the active layer;
an electrode pattern disposed on the active layer and the first insulation film and offsetting from the second insulation film;
a first electrode disposed on the first insulation film;
a fifth signal line disposed on the second insulation film and crossing the first, second, third, and fourth signal lines;
a light emitting layer disposed on the first electrode; and
a second electrode disposed on the light emitting layer,
wherein the first electrode contacts an upper surface of the first metal layer disposed on the active layer, and
wherein the fifth signal line is disposed on a same layer as the first electrode.

2. The display device of claim 1, wherein the electrode pattern is a gate electrode of a transistor, and
wherein one of the first metal layer and the second metal layer is a source electrode of the transistor, and another one of the first metal layer and the second metal layer is a drain electrode.

3. The display device of claim 2, wherein the transistor is a driving transistor, a switching transistor, or a sensing transistor.

4. The display device of claim 1, further comprising a plate disposed on a same layer as the first electrode and the fifth signal line,
wherein each of the first electrode, the plate, and the electrode pattern includes a lower layer and an upper layer disposed on the lower layer, and
wherein the lower layer includes a transparent conductive material, and the upper layer includes a metal layer.

5. The display device of claim 4, wherein an area where the active layer and the first metal layer overlap includes an area where the first insulation film is disposed and the second insulation film is not disposed, between the first metal layer and the plate, and wherein the first metal layer and the plate form a storage capacitor.

6. The display device of claim 5, wherein the electrode pattern is disposed on a same layer as the plate and includes a lower layer disposed on the second insulation film and including a transparent conductive material and an upper layer disposed on the lower layer and including a metal.

7. The display device of claim 4, comprising a third insulation film disposed on a portion of the lower layer of the first electrode and an entire upper layer of the first electrode; and
a bank disposed on the third insulation film.

8. The display device of claim 4, wherein the plate contacts an upper surface of the second metal layer through a contact hole provided in the first and second insulation films.

9. The display device of claim 1, comprising at least one pad electrode disposed on the substrate, and
wherein the at least one pad electrode includes a first pad electrode, a second pad electrode disposed on the first pad electrode, and a third pad electrode disposed on the second pad electrode.

10. The display device of claim 9, wherein each of the first, second, third, and fourth signal lines includes a first layer and a second layer disposed on the first layer, and wherein the first pad electrode is disposed on a same layer as the first layer of each of the first, second, third, and fourth signal lines and the active layer, and
wherein the second pad electrode is disposed on a same layer as the second layer of each of the first, second, third, and fourth signal lines and the first and second metal layers.

11. The display device of claim 9, wherein the first electrode includes a lower layer and an upper layer disposed on the lower layer, and the third pad electrode is disposed on a same layer as the lower layer of the first electrode.

12. The display device of claim 1, wherein the first insulation film includes an area offsetting from a portion of a surface of the active layer, and
wherein an area of the active layer, offsetting from the first insulation film, is a conductive area.

13. The display device of claim 1, wherein the first insulation film overlaps an entire upper surface and an entire side surface of the active layer, and
wherein a remaining area of the active layer, except for an area overlapping the electrode pattern, is an ion-doped area.

14. The display device of claim 1, further comprising a light blocking layer disposed under the active layer and overlapping a channel area of the active layer.

15. The display device of claim 1, wherein the substrate includes an emission area and a non-emission area, and
wherein the second insulation film includes a plurality of slits in the non-emission area.

16. The display device of claim 15, wherein at least one of the plurality of slits in the second insulation film is provided in the non-emission area between different emission areas.

17. The display device of claim 15, wherein the active layer is an active layer of a driving transistor, and
wherein the plurality of slits in the second insulation film are disposed to correspond to at least one of three side surfaces of a channel area of the active layer of the driving transistor disposed in the non-emission area.

18. The display device of claim 1, wherein the second insulation film has a flat surface.

19. A display panel, comprising:
a substrate including an emission area and a non-emission area;
first, second, third, and fourth signal lines and an active layer disposed on the substrate the first, second, third, and fourth signal lines spaced apart from each other;
a first metal layer and a second metal layer disposed on a portion of an upper surface of the active layer and spaced apart from each other;
a first insulation film disposed on the first and second metal layers;
a second insulation film disposed on the first insulation film and overlapping at least a portion of the first and second metal layers disposed on the active layer, overlapping the first, second, third, and fourth signal lines, and offsetting from a portion of the upper surface of the active layer;
an electrode pattern disposed on the active layer and the first insulation film and offsetting from the second insulation film;
a first electrode disposed on the first insulation film and extending in the emission area and the non-emission area;
a fifth signal line disposed on the second insulation film and crossing the first, second, third, and fourth signal lines;

a light emitting layer disposed on the first electrode; and
a second electrode disposed on the light emitting layer,
wherein the first electrode contacts an upper surface of the first metal layer disposed on the active layer, and
wherein the fifth signal line is disposed on a same layer as the first electrode.

20. The display panel of claim 19, wherein the electrode pattern is a gate electrode of a transistor, and
wherein one of the first metal layer and the second metal layer is a source electrode of the transistor, and another one of the first metal layer and the second metal layer is a drain electrode of the transistor.

* * * * *